(12) United States Patent
Ginosar et al.

(10) Patent No.: US 7,554,475 B2
(45) Date of Patent: Jun. 30, 2009

(54) LOW-POWER INVERTED LADDER DIGITAL-TO-ANALOG CONVERTER

(75) Inventors: Ran Ginosar, Nofit (IL); Yevgeny Perelman, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 0 days.

(21) Appl. No.: 11/909,618

(22) PCT Filed: Mar. 20, 2006

(86) PCT No.: PCT/IL2006/000405
§ 371 (c)(1),
(2), (4) Date: Jun. 16, 2008

(87) PCT Pub. No.: WO2006/103673
PCT Pub. Date: Oct. 5, 2006

(65) Prior Publication Data
US 2008/0303704 A1      Dec. 11, 2008

(51) Int. Cl.
H03M 1/78  (2006.01)
(52) U.S. Cl. .............................. 341/154; 341/144
(58) Field of Classification Search ............... 341/154, 341/144, 145, 148, 153
See application file for complete search history.

(56) References Cited
U.S. PATENT DOCUMENTS
5,252,975 A * 10/1993 Yuasa et al. ................. 341/145
5,703,588 A     12/1997 Rivoir et al.

OTHER PUBLICATIONS

B. Razavi Principles of Data Conversion System Design, IEEE Press, 1995.
M.J.M. Pelgrom, "A 10-bit 50-MHz CMOS D/A Converter with 75-Ω Buffer," IEEE Journal of Solid State Circuits, vol. 25, No. 6. pp. 1347-1352, Dec. 1990.
F. Maloberti et al, Power Consumption Optimization of 8-bit, 2MHz Storage Scaling Subranging CMOS 0.5µm DAC in Process IEEE Intl. Conf.on Electronics, Circuits and Systems (ICECS '96), Rodos, Greece, Oct. 1996, pp. 1162-1165.
L.E. Boylston et al, "Enhancing Performance in Interpolating Resistor String DAC's," in Process IEEE 45th Midwest Symposium on Circuits and Systems, (MWSCAS '02), vol. 2, Aug. 2002, pp. 541-544.

* cited by examiner

Primary Examiner—Rexford Barnie
Assistant Examiner—Joseph Lauture
(74) Attorney, Agent, or Firm—Edward Langer, Adv.; Shibolet & Co.

(57) ABSTRACT

An inverted ladder circuit for a Digital to Analog Converter (DAC) having an input binary word representing an input value and an output current corresponding to a converted analog value. The inverted ladder circuit includes at least two fine resistor ladders, including at least an upper fine resistor ladder and a lower fine resistor ladder. The inverted ladder circuit also includes a coarse resistor ladder having a corresponding plurality of coarse ladder resistors, wherein the coarse resistor ladder slides upon the at least two fine resistor ladders. The inverted ladder circuit also includes a plurality of upper fine switches and a plurality of lower fine switches, wherein the switches operate in parallel according to the lower five bits of the input binary word. The plurality of fine ladder resistors are matched with the plurality of coarse ladder resistors to obtain current proportional to the input binary word. The output resistance and parasitic capacitance are reduced.

13 Claims, 9 Drawing Sheets

LOW-POWER INVERTED LADDER DIGITAL-TO-ANALOG CONVERTER

FIELD OF THE INVENTION

The present invention relates generally to ladder architecture for digital to analog converters (DAC's), and more particularly to a low power inverted ladder DAC, where a most significant bit (MSB) ladder slides upon two static least significant bit (LSB) ladders.

BACKGROUND OF THE INVENTION

Resistor-string digital to analog converters (DAC's) are the most basic form of DAC, typically suitable for mid-accuracy applications (up to 10 bits). They are of special importance in processes having no high-quality capacitors available. Among their advantages are monotonicity (the value rises and never falls; or it falls and never rises), simple design and exclusively passive circuitry.

The drawback of a "straightforward" resistor ladder is the number of elements. I.e., the number of resistors and switches equals $2^N$ in order to achieve N bits of accuracy. A large number of switches are particularly disturbing. Apart from consuming area, they load the ladder with parasitic capacitance and complicate the control logic.

Patents related to improving the speed/power of dual ladder DAC's in various ways are known in the art. For example, U.S. Pat. No. 5,703,588, Digital To Analog Converter With Dual Resistor String, by Rivoir, et al, discloses a dual resistor string digital-to-analog converter, wherein current biasing is used to isolate a first resistor string from a second resistor string. The first resistor string consists of multiple first resistors and a first switch network responsive to the most significant bits (MSB's) selectively couples the second resistor string in parallel to any one first resistor within the first resistor string. To prevent the second resistor string from drawing current from the first resistor string, a current source feeds a bias current into the second resistor string and a current drain draws the bias current from the second resistor string. The bias current is adjusted such that the voltage drop across the whole of the second resistor string is equal to the voltage drop across any one first resistor within the first resistor string. Use of a current source and current drain allows one to freely adjust the number of MSB's, least significant bits (LSB's) and both first and second resistor magnitudes to obtain optimum performance, without concern for any adverse nonlinearity effects.

Also, U.S. Pat. No. 5,252,975, Digital To Analog Converter Having Resistor Networks, by Yuasa, et al, teaches a D/A converter, including a first resistor network, said network including K resistors, where K is an integer, and a second resistor network including L resistors connected in series, where L is an integer. The sum of resistances of the L resistors is approximately equal to the resistance of each of the K resistors. The D/A converter further includes a first switching part, coupled to the K resistors, for selecting (K−1) resistors among the K resistors in accordance with a digital input signal and for forming a series circuit including the (K−1) resistors and the second resistor network connected in series, first and second voltages being applied to respective ends of the series circuit. Furthermore, the D/A converter includes a second switching part, coupled to the second series circuit, for connecting one of the L resistors to an output terminal of the D/A converter.

The prior art of DAC ladder design includes the following references:

[1] B. Razavi, *Principles of Data Conversion System Design*, IEEE Press, 1995

[2] M. J. M. Pelgrom, "A 10-bit 50-MHz CMOS D/A Converter with 75-Ω Buffer," *IEEE Journal of Solid State Circuits*, vol. 25, no. 6, pp. 1347-1352, December 1990.]

[3] F. Maloberti, R. Revoir and G. Torelli, "Power Consumption Optimization of 8-bit, 2 MHz Storage Scaling Subranging CMOS 0.5 μm DAC in *Process IEEE Intl. Conf. on Electronics, Circuits and Systems (ICECS '96)*, Rodos, Greece, October 1996, pp. 1162-1165.

[4] L. E. Boylston, J. K. Brown and R. Giger, "Enhancing Performance in Interpolating Resistor String DAC's," in *Process IEEE 45th Midwest Symposium on Circuits and Systems, (MWSCAS '02)*, VOL. 2, August 2002, pp. 541-544.

The requirement for $2^N$ elements can be relaxed through interpolating the voltages of the coarse most significant bit (MSB) ladder by means of the second fine, or least significant bit (LSB) ladder cite Razavi [1], Pelgrom [2] and Maloberti, et al [3]. If the coarse ladder provides $N_c$ levels and the fine ladder provides $N_f$ levels, the overall complexity is reduced to $2^{N_c}+2^{N_f}$.

Using a secondary ladder degrades the DAC differential non-linearity (DNL), due to the finite ohmic load on the primary ladder. Static current flow through the secondary ladder causes a voltage drop on the inter-ladder switches, increasing the DNL even further. The errors are introduced at the fine ladder end points. For a DAC, DNL error is the difference between the ideal and the measured output value between successive DAC codes. An ideal DAC would have analog output values exactly one code apart (DNL=0). A DNL specification of greater than or equal to 1 LSB guarantees monotonicity.

Integral non-linearity (INL) is the deviation of the values on an actual transfer function from a straight line. This straight line is either a best-fit straight line or a line drawn between the end points of the transfer function, once offset and gain errors have been nullified. "Relative accuracy" is a term often used to refer to INL.

Several techniques for isolating the fine ladder from the coarse ladder by means of active buffers are presented in Boylston [4]. The drawback of this approach is the requirement for two large common mode buffers, with offsets matched up to the required DAC accuracy over the whole output range. Bandwidth requirement on the buffers contributes to overall power consumption.

Compensating for the secondary ladder loading effects provides an alternative to isolation by active circuitry. While completely passive compensation is possible, it severely degrades the dynamic performance. This is reviewed below.

Pelgrom [2] suggested another passive compensation scheme, which does not deteriorate the performance at the expense of a great increase in switch matrix complexity, with a return to $2^N$ elements.

Maloberti, et al, [3] proposed compensating the load by forcing a constant current through the fine ladder. Only DAC active circuitry is involved, posing no bandwidth requirements. The power penalty therefore is modest. The switch matrix complexity is maintained at $2^{N_c}+2^{N_f}$.

It would therefore be advantageous to provide a DAC that which addresses the issue of output resistance and parasitic capacitance by employing active circuitry current biasing of the LSB ladder.

SUMMARY OF THE INVENTION

Accordingly, it is a principal object of the present invention to provide an inverted ladder Digital to Analog Converter (DAC), where an most significant bit (MSB) ladder slides upon two static least significant bit (LSB) ladders.

It is another object of the present invention to provide an inverted ladder DAC, where there are no active components.

It is a further object of the present invention to provide an inverted ladder DAC which achieves lower output resistance and parasitic capacitance for a given power budget.

It is one more object of the present invention to provide an inverted ladder DAC which addresses the issue of output resistance and parasitic capacitance by employing active circuitry current biasing of the LSB ladder.

In accordance with a preferred embodiment of the present invention there is provided an inverted ladder circuit for a Digital to Analog Converter (DAC) having an input binary word representing an input value and an output current corresponding to a converted analog value. The circuit includes at least two fine resistor ladders comprising at least an upper fine resistor ladder and a lower fine resistor ladder. The circuit also includes a coarse resistor ladder having a plurality of corresponding resistors, that slides upon said at least two fine resistor ladders and a plurality of upper fine switches and a plurality of lower fine switches, wherein the switches are operable in parallel to define a combined output resistance in accordance with the lower five bits of the input binary word, such that upon matching the plurality of fine ladder resistors matched with the plurality of coarse ladder resistors, a current is obtained proportional to the input binary word, and wherein the output resistance and parasitic capacitance are reduced.

In an exemplary preferred embodiment of the present invention, a DAC is presented in the form of a 0.35 um, 3.3V implementation consuming 22 uA current with output resistance of 40 kOhm and effective parasitic capacitance of 650 fF.

A resistor string DAC architecture is used with $2^N_c + 2^N_f$ switch complexity. The proposed, architecture outperforms the existing circuits of the same complexity in terms of load driving ability and ladder parasitic capacitance under equal supply current. The following are 2 prior art schemes for fine ladder compensation.

FIG. 1 is a prior art schematic diagram, showing a passive compensation circuit for an interpolating, dual resistor ladder DAC having dummy switches, typically using a fine, LSB ladder floating upon a static MSB ladder. Here the switch voltage drop is compensated by introducing dummy switches between the LSB ladder resistors. If dummy switches are identical to switches in the MSB switch matrix, every LSB ladder step includes an LSB resistor and a switch. LSB zero level is obtained at LSB tap number when the switch is opened.

An ohmic load presented by the fine ladder 110 to the coarse ladder 120 is brought down to an acceptable level by choosing a sufficiently large fine ladder resistance $R_f$ 130. The condition to satisfy is one of keeping the coarse resistor voltage drop, due to fine ladder loading, below a fraction alpha, of an LSB:

$$[(V_{ref}/2^N_c \cdot R_c)][R_c - R_c \| (2^N_f \cdot R_f)] < \text{alpha} \cdot V_{ref} 2^N,$$

which can be further simplified to:

$$R_f \gg R_c / \alpha \quad \text{(equation 1)}$$

This DAC will have maximal output resistance when both ladders are at the middle:

$$r_o = (R_c \cdot 2^N_c)/4 + (R_f \cdot 2^N_f)/4$$

substituting equation 1, and using for the ladder current as follows:

$$I = I_c = V_{ref}/(2^N_c) \cdot R_c \quad \text{(equation 2)}$$

the output resistance becomes:

$$r_o = (V_{ref}/4I)(1 + 2^{\hat{}}(N_f - N_c)/\alpha) \quad \text{(equation 3)}$$

Eq. 3 shows that a heavy penalty in dynamic performance is incurred when using the secondary ladder. As one will usually keep the DNL at least at half LSB (often at quarter LSB), and choose $N_c$ approximately equal to $N_f$, $r_o$ is increased by a factor of 2-5.

Further degradation of dynamic performance comes out of the dummy switches that contribute to capacitive loading on the fine ladder.

FIG. 2 is prior art schematic diagram, showing a current bias compensation circuit for an interpolating, dual resistor ladder DAC having dummy switches, typically using a fine, LSB ladder floating upon a static MSB ladder. Ideally the current $I_f$ 210 flowing through the fine ladder 220 satisfies the condition:

$$2^N_f \cdot R_f \cdot I_f = R_c \cdot I_c \quad \text{(equation 4)}$$

In that case, there is no current flow through MSB switches eliminating both the loading on the coarse ladder 230 and the voltage drop on the MSB switch matrix.

The advantage of this scheme is that there is no need to satisfy Eq. 1. Instead, Eq. 4, which has a degree of freedom $I_c/I_f$ has to be satisfied. Fine ladder resistance $R_f$ 240 can be significantly decreased. Dummy switches are no longer needed, since there is no voltage drop on the MSB switch matrix for which to compensate. The output resistance of this structure is:

$$r_o = (R_c \cdot 2^N_c)/4 + (R_f \cdot 2^N_f)/4$$

Substituting Eq. 4 and Eq. 2:

$$r_o = (V_{ref}/4)(1/[2^N_c \cdot I_f] + [1/I_c])$$

The current consumption is given by:

$$I = I_c = I_f \cdot k$$

Since $I_f$ is generated by active circuitry, there is more than a single branch carrying $I_f$, which is the reason for the presence of k. The circuit presented in Maloberti, et al [3], has k=3.

Minimizing $r_o$ under a given I leads to:

$$r_o = (V_{ref}/4I) \cdot (1 + 2 \cdot \text{sqrt}[k/2^N_c]) \quad \text{(equation 5)}$$

This is a dramatic improvement over Eq. 3}: the increase in $r_o$ due to the presence of the fine ladder is much lower: 40%-60%.

The speed gain comes at the expense of added circuit complexity. Special circuitry is required for generating precise bias current to keep the ladders balanced. The currents at the top and the bottom of the ladder must be closely matched. Active generation of bias currents may pose some difficulty when the output voltage limits are close to supply rails. Bias generation circuitry will probably include additional elements requiring more current, not directly related to $I_f$, such as the Operational Transconductance Amplifier (OTA) in Maloberti, et al [3].

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

For a better understanding of the invention with regard to the embodiments thereof, reference is made to the accompanying drawings, in which like numerals designate corresponding elements or sections throughout, and in which.

DETAILED DESCRIPTION OF A PREFERRED EMBODIMENT

The principles and operation of a method and an apparatus according to the present invention may be better understood with reference to the drawings and the accompanying description, it being understood that these drawings are given for illustrative purposes only and are not meant to be limiting.

Figure 1:
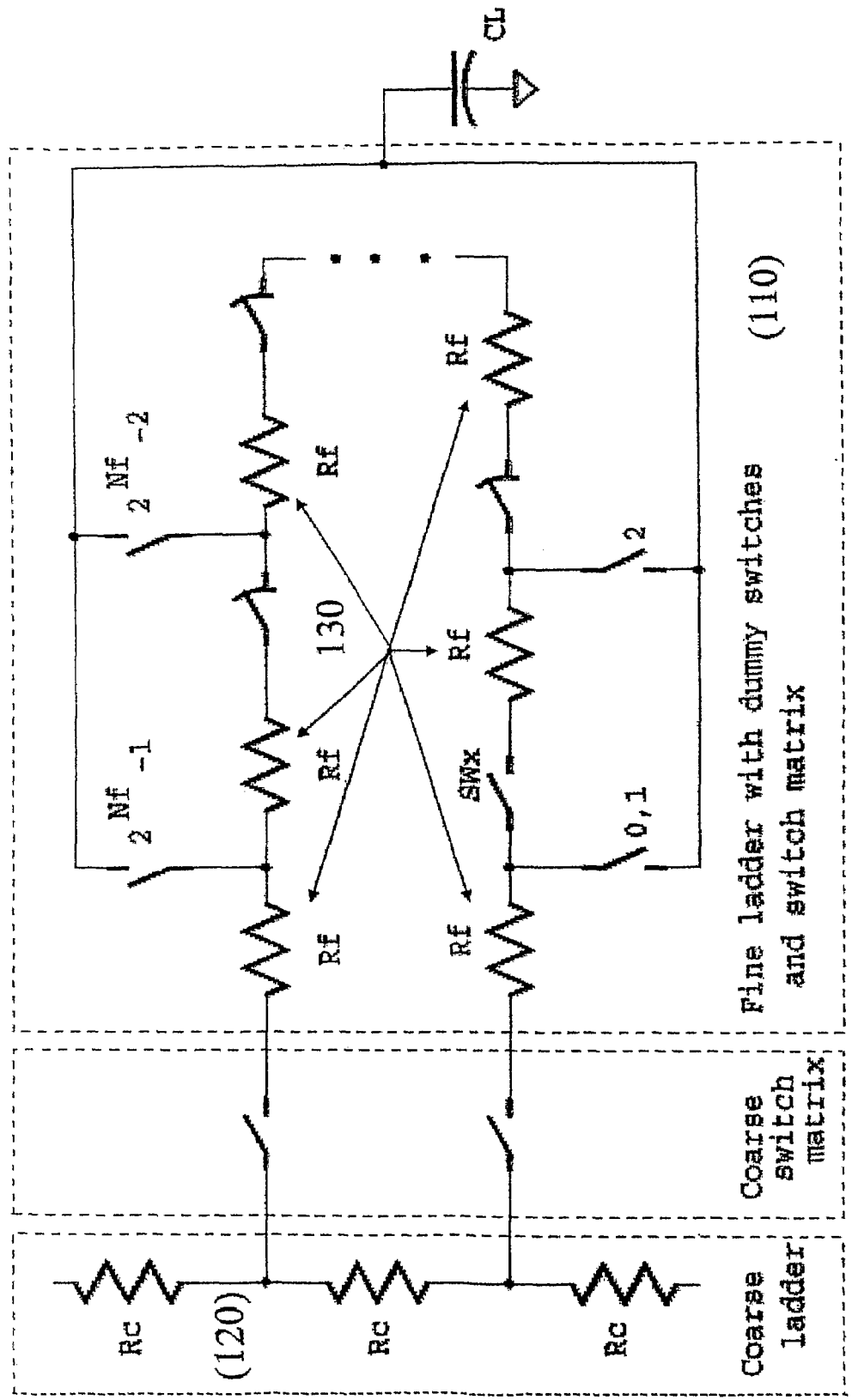
FIG. 1 is a prior art schematic diagram, showing a passive compensation circuit for an interpolating, dual resistor ladder DAC having dummy switches, typically using a fine, LSB ladder floating upon a static MSB ladder.
Figure 2:
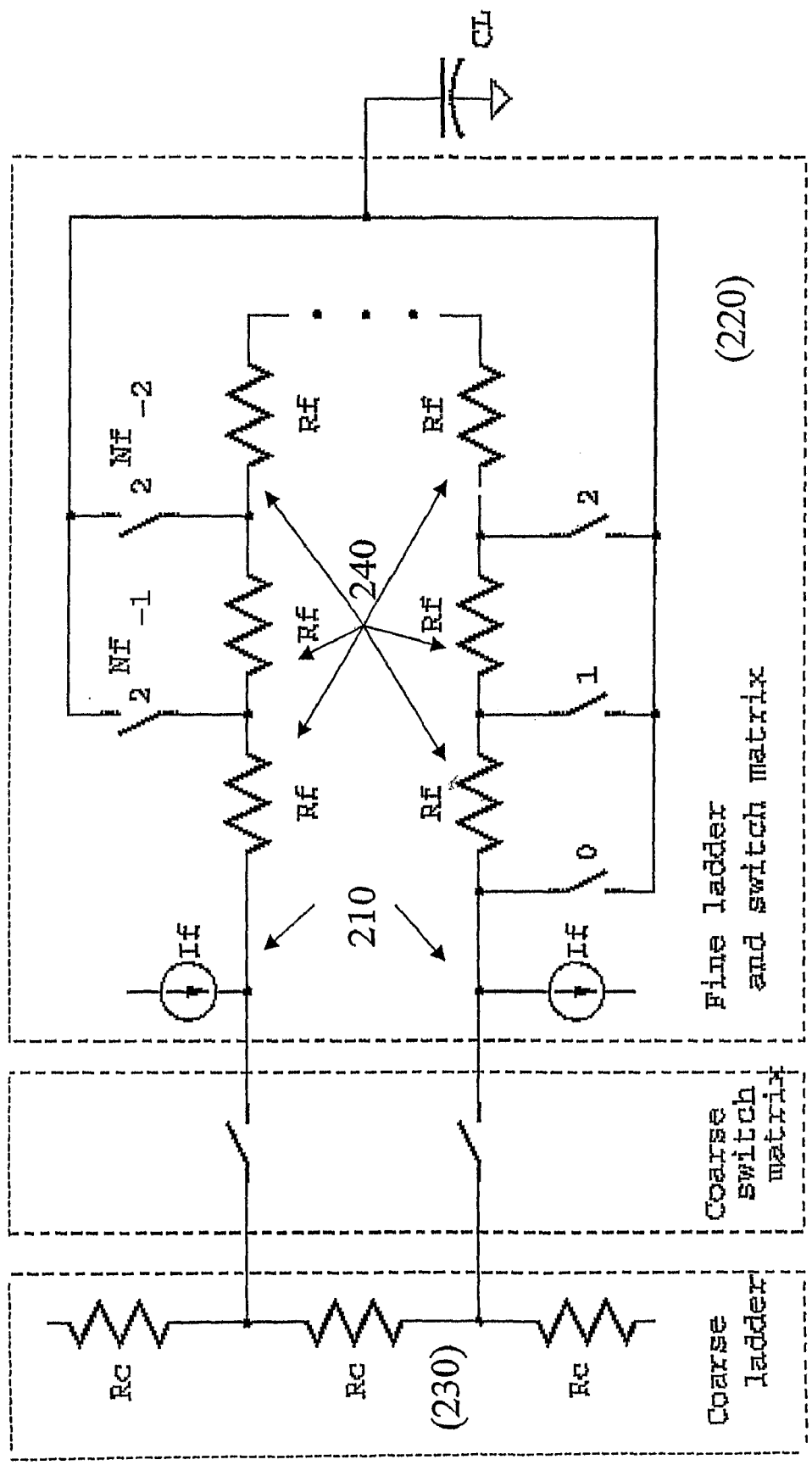
FIG. 2 is prior art schematic diagram, showing a current bias compensation circuit for an interpolating, dual resistor ladder DAC having dummy switches, typically using a fine, LSB ladder floating upon a static MSB ladder.
Figure 3:
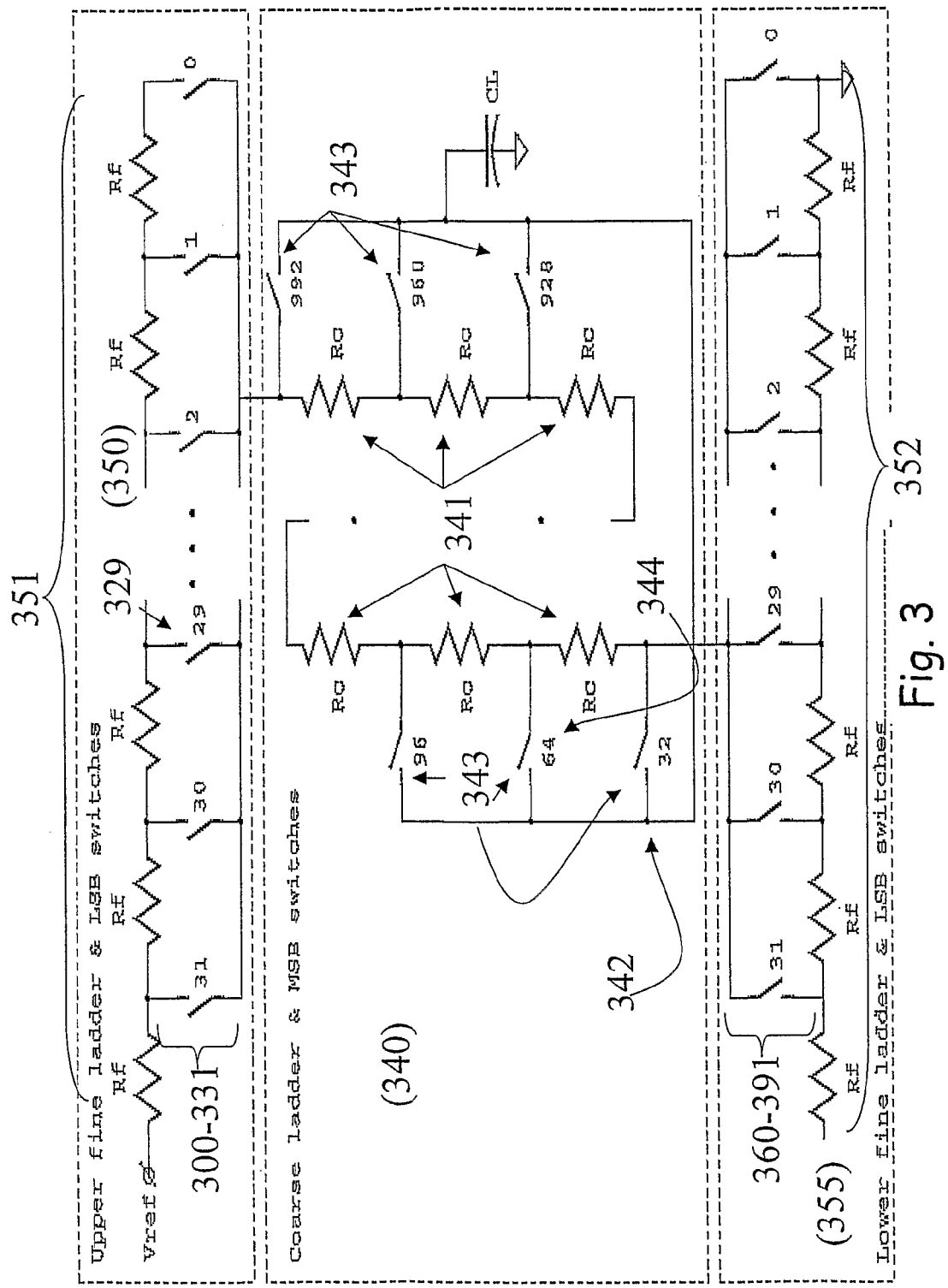
FIG. 3 is a schematic diagram of an inverted ladder circuit, constructed in accordance with the principles of the present invention.

FIG. 3 is a schematic diagram showing the architecture of an inverted ladder circuit for a DAC, constructed in accordance with the principles of the present invention. For simplicity an exemplary 10 bit DAC is shown with the number of fine elements $N_f$=the number of coarse elements $N_c$=32. Each fine element comprises a resistor $R_f$ in parallel with a switch across the switch of the previous element. All fine resistors are of the same value of resistance $R_f$. Unlike the prior art schemes of FIGS. 1 and 2, where the LSB ladder floats upon the coarse ladder, an exact opposite, or inverse approach is used. In the present invention a coarse MSB ladder 340 slides upon two fine LSB ladders, upper fine ladder 350 and lower fine ladder 355. Thus, the inventive principle is one of an inverted ladder. Upper LSB switches 300-331 and corresponding lower LSB switches 360-391 operate in parallel according to the lower five bits of the input word.

For example, when the lower five bits of the input word are 11101, the 29$^{th}$ switches 329 and 369 are shorted in both the top and the bottom ladders. The MSB switches 343 operate on the upper five bits of the input code, thus their numbers are shown in steps of 32 (because $2^5$=32, i.e., 5 binary [2-state] positions). The total string resistance is therefore kept constant, independent of the LSB ladder position. This occurs because each time the position is switched, an $R_f$ resistance 351 is removed from the top and an $R_f$ resistance 352 is added at the bottom at the same time, or vice versa. The current flow through the ladder is given by:

$$I=V_{ref}/[(2^{N_f})\cdot R_f+2^{N_c}-1)\cdot R_c)] \qquad \text{(equation 6)}$$

and the output voltage is:

$$V_o=(L\cdot R_f+M\cdot R_c)\cdot I$$

whereby L and M denote the lower $N_f$ bits and the higher $N_c$ bits of the input code, respectively. In order for the circuit to operate correctly, the following condition must be satisfied:

$$2^{N_f}\cdot R_f=R_c \qquad \text{(equation 7)}$$

Note that among similar equations: Eq. 1; Eq. 4; and Eq. 7, Eq. 7 gives the smallest value for $R_f$ compared to coarse resistance $R_c$ 341, minimizing the penalty for the usage of the LSB ladder. In fact, when Eq. 7 holds, Eq. 6 can be written as:

$$I=V_{ref}/[R_c+(2^{N_c}-1)\cdot R_c)]=V_{ref}/[(2^{N_c})\cdot R_c]$$

and the output resistance (maximum at the middle code) can be written as:

$$r_o=(R_c\cdot 2^{N_c})/4=(V_{ref}/4I) \qquad \text{(equation 8)}$$

Indeed, there is no increase in $r_o$ due to the LSB ladder. The conclusion is that the inverted ladder is expected to give the best load-driving ability for a given power compared to the prior art ladders of FIGS. 1 and 2.

Additional advantages of the present invention are related to the switch matrix. First, note that upper LSB ladder 350 always operates close to $V_{ref}$, while lower LSB ladder 355 operates close to ground. Thus, upper LSB switches 300-331 can be made of Positive-channel Metal-Oxide Semiconductor (PMOS) transistors only, while lower switches 360-391 are made of Negative-channel Metal-Oxide Semiconductor (NMOS). The immediate outcome is that the inter-ladder switch matrix in the scheme of the present invention has half the parasitic switch capacitance compared to the prior art current biasing scheme. Second, parasitic capacitors of LSB switches 300-331 and 360-391 have a very low driving resistance (i.e. Thevenin equivalent) as they are placed close to the supply rails.

It can be shown that these switches can be made very large with negligible effect on the total equivalent parasitic capacitance.

Regarding the effect of switch resistance, there is always a single NMOS and a single PMOS switch in the string that carry static current. Thus, differential non-linearity (DNL) is not affected by the switches, up to matching of the switch resistances. In order not to pose strong requirements on switch matching, the switch resistance should be small enough compared to $R_f$.

A drawback of the proposed scheme compared to the existing ones is that $R_f$ has to be matched to $R_c$. In the passive scheme of prior art FIG. 1 they are completely unrelated, as long as the loading condition holds. In the current biasing scheme of prior art FIG. 2, the balancing condition can be satisfied by tuning $I_f/I_c$, even if there is a small deviation in $(2^{N_f})\cdot R_f$. In the present invention of FIG. 3, a mismatch between $R_c$ and $(2^{N_f})\cdot R_f$ results in DNL degradation at the LSB ladder end points. Thus $R_f$ and $R_c$ are preferably made of identical unit resistances. That does not necessarily imply that there must be $2^N$ resistors, since $R_f$ can be made of parallel-connected units, but the number of unit resistors can be large.

The following presents a simulation-based comparison between the three above-described architectures. The performance of the inverted ladder has been evaluated compared to current biasing and passive compensation schemes. Evaluation was carried out through numerical simulations (SPECTRE), with parasitics (except wire parasitics) included in the schematics. A 3.3V, 0.35 μm process has been used with poly resistors.

The purpose of the evaluation was to determine the settling times of the test cases under given power consumption for various loads. For each of the three schemes, a 10-bit DAC, with $N_f$ and $N_c$ of 5 has been used. Every circuit was optimized once for 22 μA and once for 86 μA total current. Both the MSB and the LSB switch matrices were implemented in two levels:

a first level of eight 4-to-1 multiplexers (MUX's);
and a second level of 8-to-1 MUX.

Dummy switches in the passive-compensated DAC were accordingly sized to half of the MSB switches.

Regarding Integral non-linearity (INL), the MSB resistor area was adjusted to keep $\sigma_{INL}$ of the middle tap below one LSB (about 0.7 LSB). In both the current biasing and passive compensation schemes the smallest possible LSB resistors were used. In the inverted ladder of the present invention they were constructed from unit resistors matched to the MSB ladder: $R_f = R_u$ and $R_c = 32 R_u$.

The bias current $I_f$ was determined according to the optimum calculated in Eq. 5; k was (optimistically) chosen to be 1. Eq. 5 was verified by trying values slightly above and below the estimation and proved accurate.

Figure 4A:
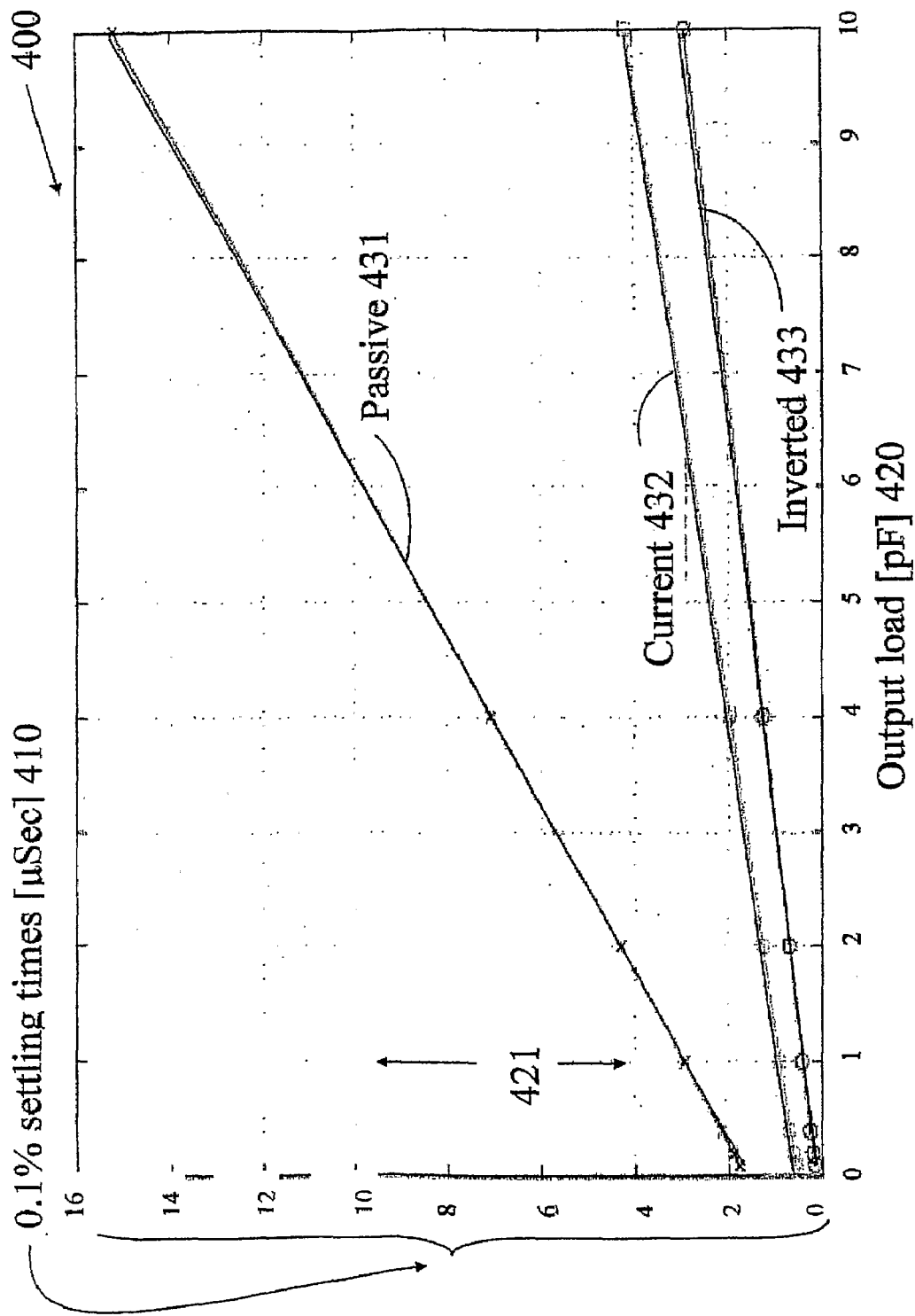
FIGS. 4a and 4b are graphs showing the 0.1% settling times versus output load for the tested circuits for relatively slow (22 µA) and fast (86 µA) settling times, respectively.
Figure 4B:
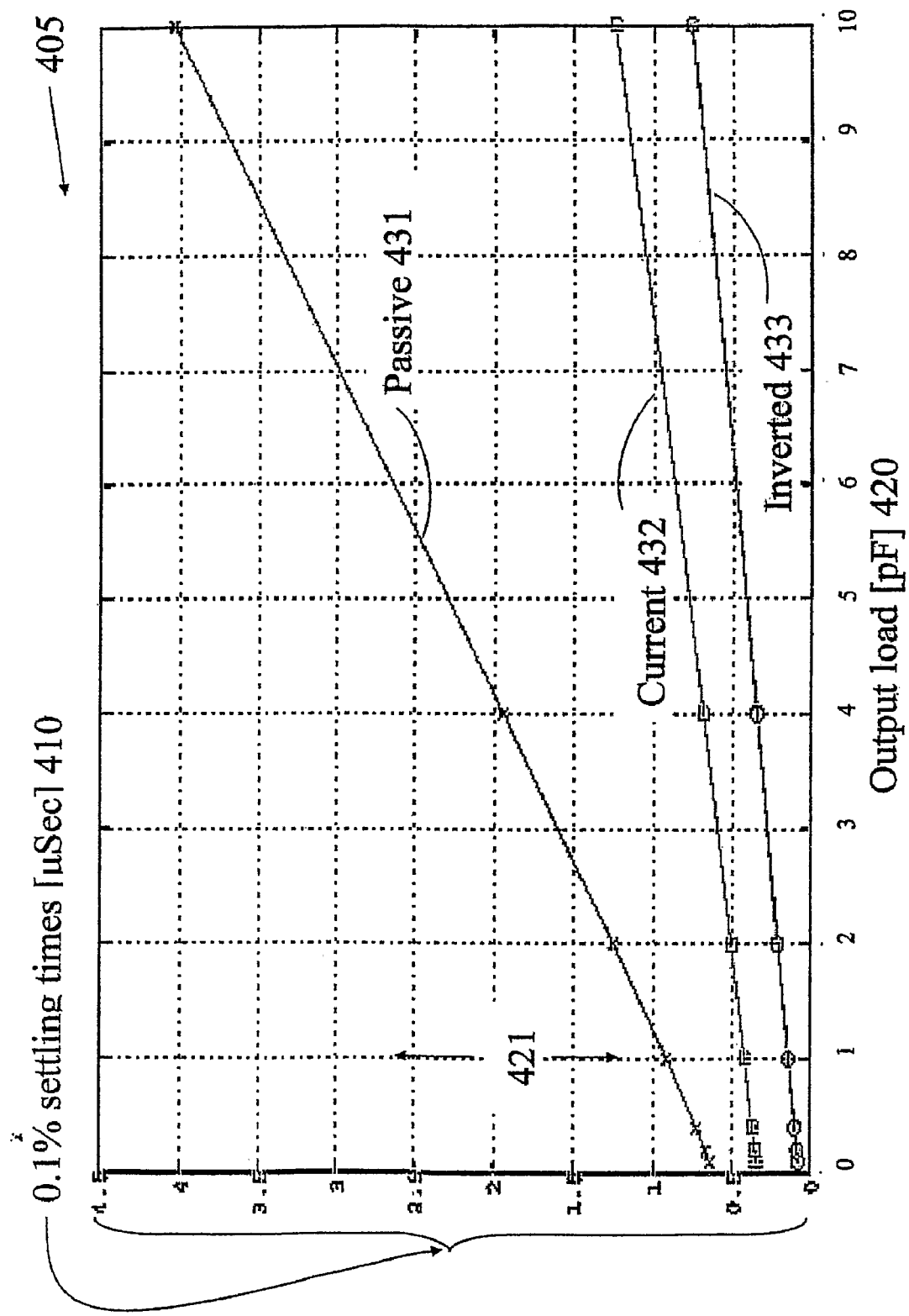

FIGS. 4a and 4b are graphs showing the 0.1% settling times 410 versus the output load [pF] 420 for the tested circuits for relatively slow (22 μA) 400 and fast (86 μA) 405 settling times, respectively. Settling time 410 appears to have a linear dependence on output load 420 for a load capacitance above 100 fF 421. It can therefore be characterized by two parameters: the first is $r_{eq}$, Thevenin equivalent resistance at the output node. Neglecting the switch resistance, Thevenin equivalents, $r_{eq}$, have been calculated for the three schemes: passive 431; current 432; and inverted 433. The other parameter is the equivalent parasitic capacitance $C_p$, which must be added to the output load. The time constant is:

$$T_0 = r_{eq} \cdot (C_L + C_p)$$

and the settling time to half LSB precision is:

$$t_s = 10 \ln(2) \cdot r_{eq} \cdot (C_L + C_p) \quad \text{(equation 9)}$$

Test case circuit parameters, together with equivalent output resistance $r_0$ and parasitic capacitance $C_p$, are summarized in Table I, entitled Test Case Circuit Parameters and Simulated Dynamic Performance.

TABLE I

| $I_{total}$ | 22 μA | | | 86 μA | | |
|---|---|---|---|---|---|---|
| DAC type | Passive | Current | Inverted | Passive | Current | Inverted |
| MSB res., [kΩ] | 4.7 | 5.6 | 4.7 | 1.2 | 1.4 | 1.2 |
| MSB res., L/W, [μm] | 118/1.5 | 128/1.4 | 118/1.5 | 70/3.2 | 74/2.8 | 70/3.2 |
| LSB res., [kΩ] | 19 | 0.9 | 0.15 | 4.7 | 0.25 | 0.04 |
| LSB res., L/W, [μm] | 209/0.8 | 14/1 | 3.7/1.5 | 52/0.8 | 3.7/1 | 2.2/32 |

TABLE I-continued

| $I_{total}$ | 22 μA | | | 86 μA | | |
|---|---|---|---|---|---|---|
| DAC type | Passive | Current | Inverted | Passive | Current | Inverted |
| MSB switch, Wn, Wp [μm] | 4, 6.4 | 3, 5 | 3, 5 | 16, 25.6 | 12, 20 | 12, 20 |
| LSB switch, Wn, Wp [μm] | 1, 1.6 | 3, 5 | 6, 10 | 6, 6.4 | 12, 20 | 24, 40 |
| $I_f$ [μA] | | 3.4 | | | 13.1 | |
| $r_o$, [kΩ] | 196 | 52.2 | 38.9 | 49.6 | 13 | 9.9 |
| $C_p$, [pF] | 1.2 | 1.5 | 0.54 | 1.7 | 3.7 | 1.07 |

The inverted ladder DAC shows a 25% improvement in load driving ability for a given current, when compared to the current biasing scheme. Recalling the optimistic k=1, which would be larger in a practical implementation, one expects this gap to grow further. The inverted-ladder DAC also shows 3.5-4.5 times improvement in "parasitic delay," $T_0 = r_0 \cdot C_p$, compared to current biasing. This is thanks to a much smaller $C_p$, as it is effectively loaded only by the MSB switch matrix, while the two others are loaded by both the MSB and the LSB matrices.

To prove the last point, it was attempted to load the 22 μA DAC with large LSB switches. The switches were enlarged by a factor of 4, i.e. brought to the sizes of the 86 μA DAC. The increase in $C_p$ was barely noticed. It rose to 545 fF from the 540 fF given in Table I.

The following describes a fabricated prototype, which represents an exemplary preferred embodiment of the present invention. The DAC architecture of the present invention was verified in silicon in a research chip for biological neural network interfacing. It was employed as a part of successive approximation A/D converters. It was loaded with 300 fF capacitive load. The DAC designed for the test chip was very similar to the 22 μA test case, with LSB switches twice smaller. For such a small output load the degradation in $r_0$ was insignificant, but lower $C_p$ resulted in somewhat better settling time.

After post-layout simulation the DAC showed $r_0$ of 40.8 kOhm and $C_p$ of 640 fF, some 100 fF increase due to wiring capacitance. The simulated output settling time constant for 300 fF load was about 38 nsec. The layout area was 0.22 mm².

The chip was fabricated and proved fully functional. The actual time constant measured was 41 nsec, which is indeed within the process parameters distribution.

Figure 5A:
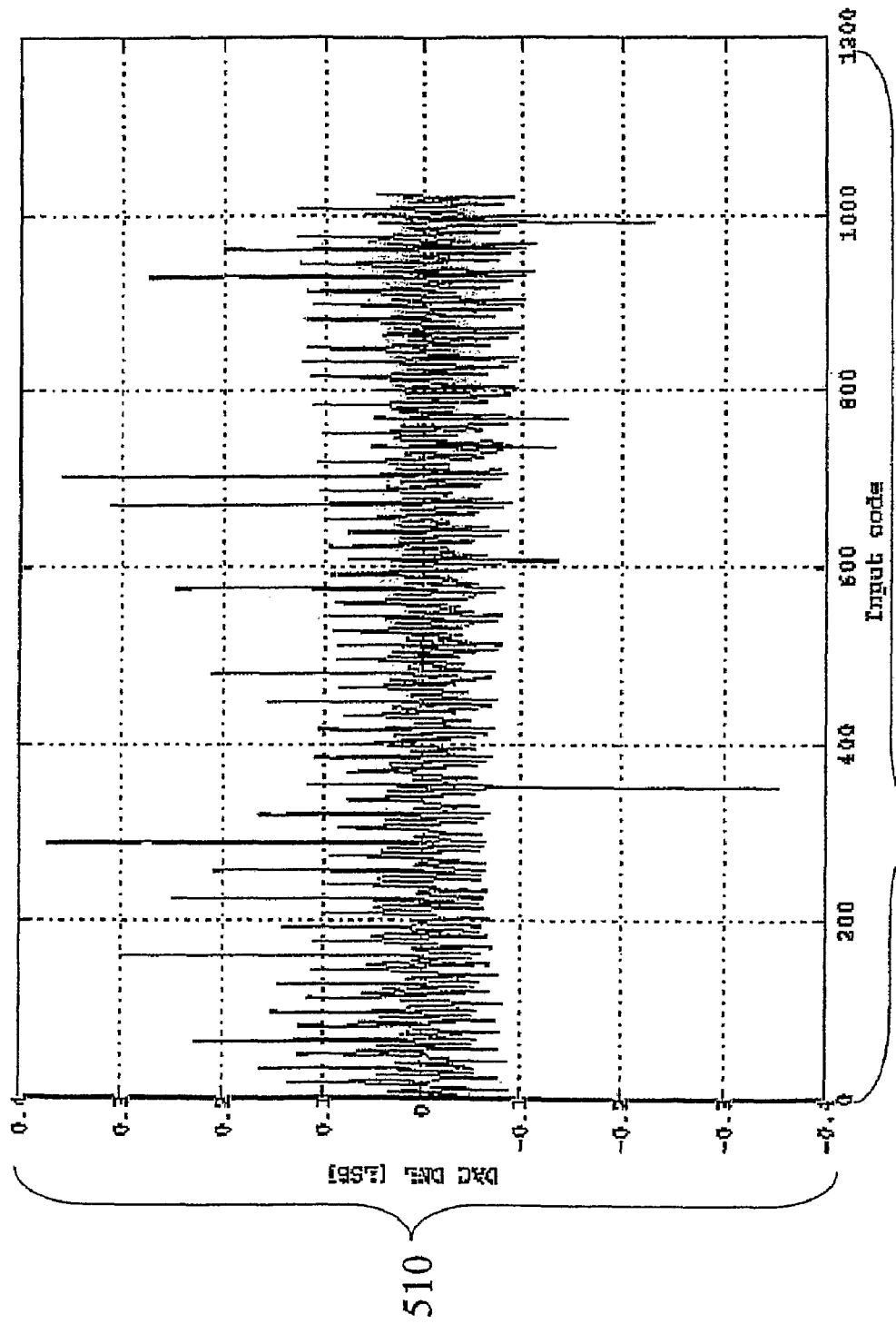
FIGS. 5a and 5b are graphs of the DNL and the INL, respectively, for a sample DAC.
Figure 5B:
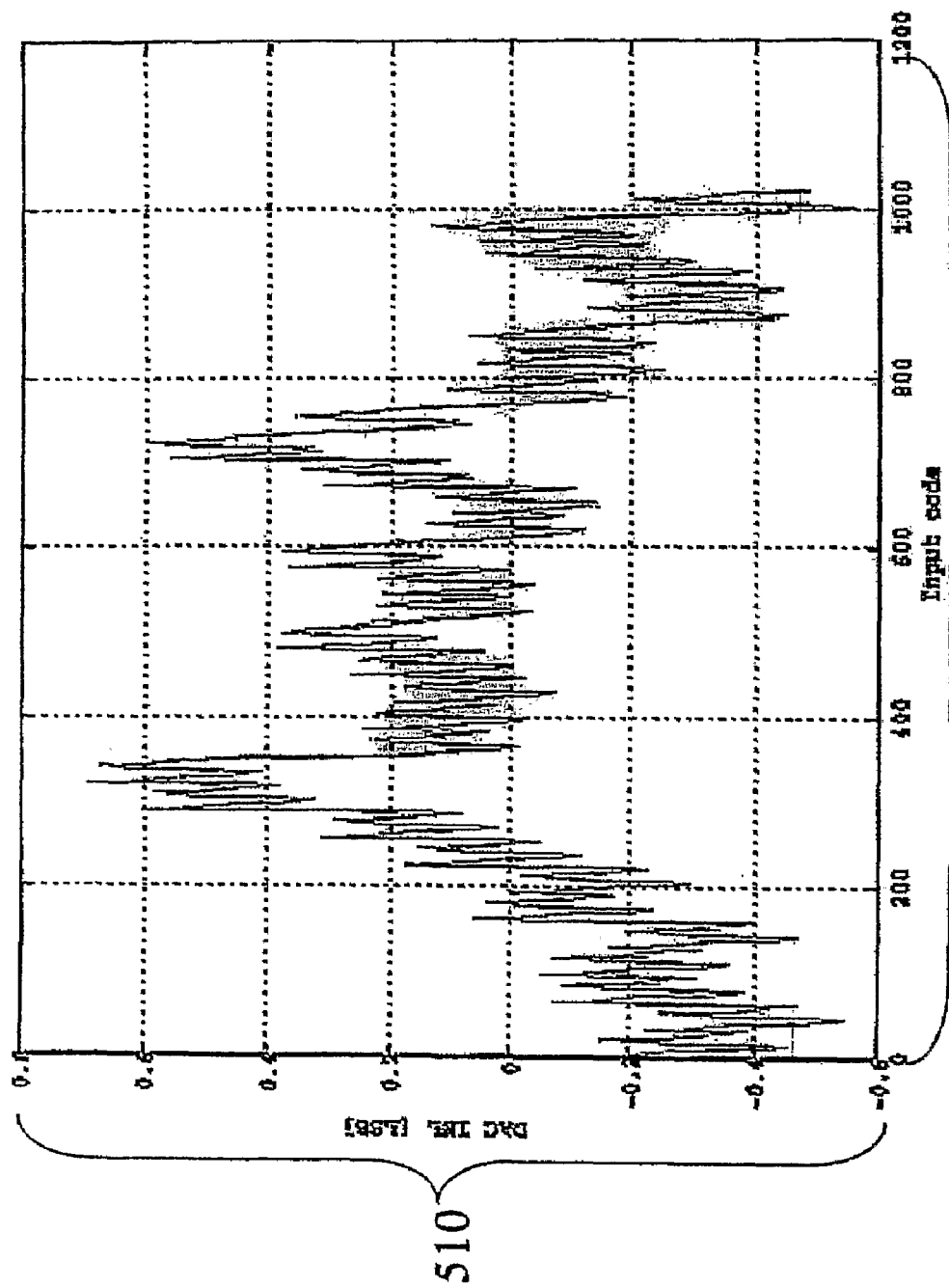

FIGS. 5a and 5b are graphs of the DNL and the INL, respectively, for a sample DAC. For a DAC, DNL error is the difference between the ideal and the measured output value between successive DAC codes (e.g., 00001 ["1"] and 00010 ["2"]). An ideal DAC would have analog output values exactly one code apart (DNL=0, or zero differential non-linearity). Thus, FIG. 5a shows the DAC DNL in the LSB 510 for successive values of input code 520.

INL is the deviation of the values on an actual transfer function from a straight line. This straight line is either a best-fit straight line or a line drawn between the end points of the transfer function, once offset and gain errors have been nullified. "Relative accuracy" is a term often used to refer to INL. Thus, FIG. 5a shows the DAC INL in the LSB 530 for successive values of input code 540.

Figure 6A:
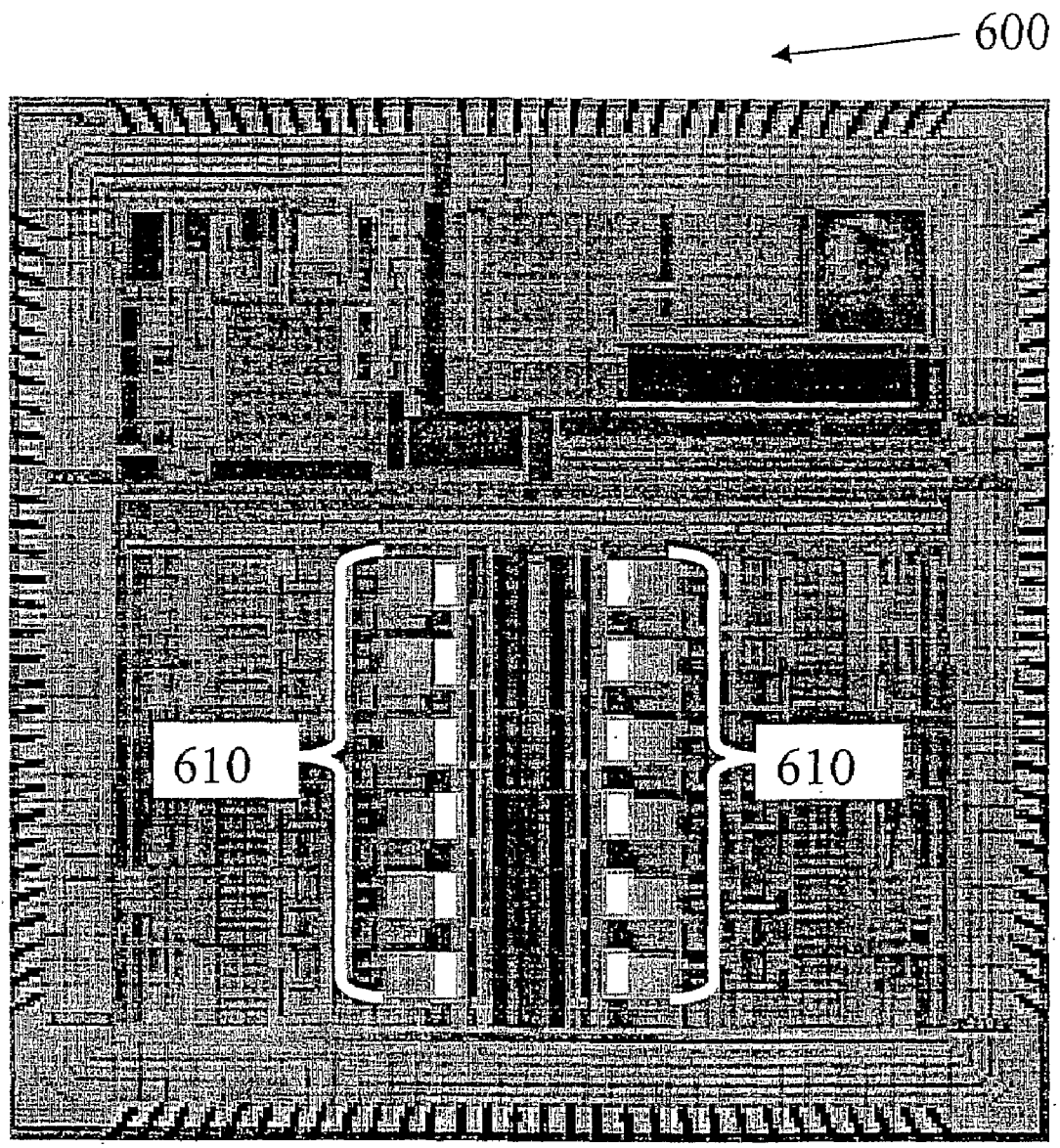
FIG. 6a is a micrograph of a group of DAC's arranged on a computer chip, constructed in accordance with the principles of the present invention.
Figure 6B:
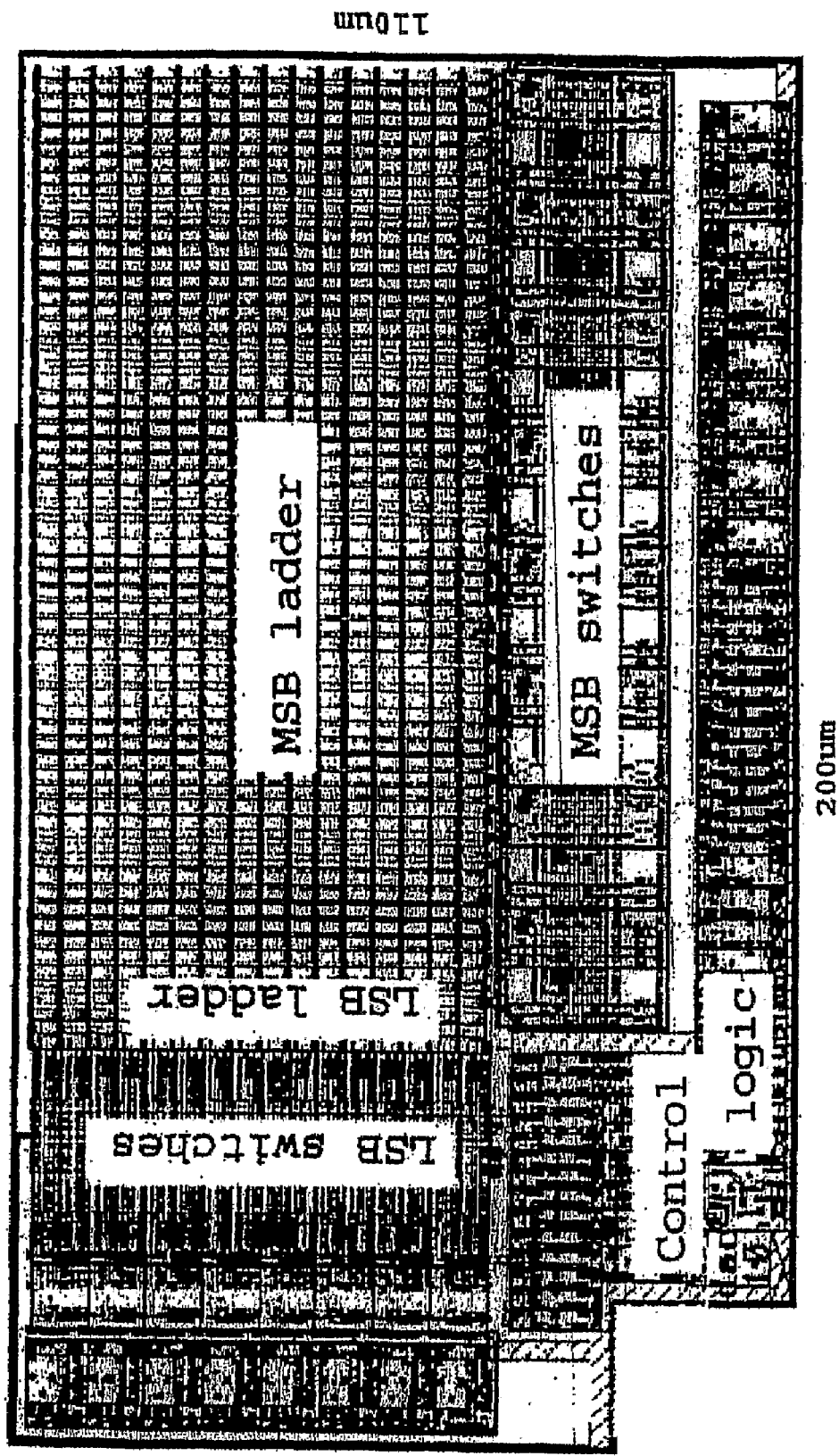
FIG. 6b is a micrograph showing the layout of one of the DAC's of FIG. 6a, constructed in accordance with the principles of the present invention.

FIG. 6a is a micrograph of a group of 2 parallel banks of 6 DAC's per bank 610, arranged on a computer chip 600, constructed in accordance with the principles of the present invention. FIG. 6b is a micrograph showing the layout of one DAC's 610 of FIG. 6a, constructed in accordance with the principles of the present invention. FIG. 6b shows the physical layout of one DAC 610: LSB ladders 320, 330; LSB switches 325, 335; MSB ladder 310; MSB switches 315; and control logic 610.

In the inverted ladder DAC of the present invention the MSB ladder floats upon the LSB ladder in opposite to existing circuits. It carries no active circuitry and is very simple to design. It was compared to existing schemes of current biasing and dummy-switch compensation through numerical simulations on a set of test cases. For a given current consumption the inverted ladder DAC provides significantly better load driving ability and up to four times lower parasitic delay.

In the present scheme the LSB ladder is no longer independent of an MSB ladder. This is overcome by matching the LSB ladder resistors with the MSB ladder resistors to obtain good DNL.

The inverted ladder DAC was fabricated on a 0.35 μm process and its performance was demonstrated to match the simulation results.

It is to be understood that the phraseology and terminology employed herein are for the purpose of description, and should not be regarded as limiting.

It is important, therefore, that the scope of the invention is not construed as being limited by the illustrative embodiments set forth herein. Other variations are possible within the scope of the present invention as defined in the appended claims and their equivalents.

We claim:

1. An inverted ladder circuit for a Digital to Analog Converter (DAC) having an input binary word representing an input value and an output current corresponding to a converted analog value, said circuit comprising:
   at least two fine resistor ladders comprising at least:
      an upper fine resistor ladder comprising a plurality of switches, each in parallel with a corresponding plurality of fine resistors; and
      a lower fine resistor ladder comprising a corresponding plurality of switches, each in parallel with a corresponding plurality of fine resistors; and
   a coarse resistor ladder having the same corresponding plurality of coarse ladder resistors and coarse ladder switches in parallel pairs,
   wherein said coarse resistor ladder slides upon said at least two fine resistor ladders, and wherein said coarse ladder switches each operate to include a preceding string of coarse resistors, and wherein both of said upper and lower fine switches are operable in parallel to define a combined output resistance in accordance with the lower five bits of the input binary word,
   such that upon matching said plurality of fine ladder resistors with said plurality of coarse ladder resistors, a current is obtained proportional to the input binary word, and such that the total string resistance is kept constant, independent of the position, and such that said circuit provides substantially improved load driving ability.

2. The converter of claim 1, wherein all components are passive.

3. The converter of claim 1, wherein said substantially improved load driving ability is manifested as lower equivalent output resistance.

4. The converter of claim 1, wherein said substantially improved load driving ability is manifested as lower parasitic capacitance delay enabled by active current biasing of said at least two fine resistor ladders.

5. The converter of claim 4, wherein said fine resistor ladders switches can be made very large with negligible effect on the total equivalent parasitic capacitance.

6. The converter of claim 4, wherein said parasitic capacitance delay is improved by a factor of 3.5-4.5 times.

7. The converter of claim 1, wherein the total resistance is kept constant, independent of the fine ladder position, whereby at any position a fine resistor is added at the bottom and a fine resistor is removed from the top at the same time.

8. The converter of claim 1, wherein said plurality of upper fine switches comprise Positive-channel Metal-Oxide Semiconductor (PMOS) transistors only.

9. The converter of claim 8, wherein at least one of said plurality of PMOS transistors is always a component in said total string resistance.

10. The converter of claim 1, wherein said plurality of lower fine switches comprise Negative-channel Metal-Oxide Semiconductor (NMOS) transistors only.

11. The converter of claim 10, wherein at least one of said plurality of NMOS transistors is always a component in said total string resistance.

12. A method for providing an inverted ladder circuit for a Digital to Analog Converter (DAC) having an input binary word representing an input value and an output current corresponding to a converted analog value, said method comprising:
   providing at least two fine resistor ladders comprising at least:
      an upper fine resistor ladder comprising a plurality of switches, each in parallel with a corresponding plurality of fine resistors; and
      a lower fine resistor ladder comprising a corresponding plurality of switches, each in parallel with a corresponding plurality of fine resistors; and
   providing a coarse resistor ladder having the same corresponding plurality of coarse ladder resistors and coarse ladder switches in parallel pairs,
   wherein said coarse resistor ladder slides upon said at least two fine resistor ladders, and wherein said coarse ladder switches each operate to include a preceding string of coarse resistors, and wherein both of said upper and lower fine switches are operable in parallel to define a combined output resistance in accordance with the lower five bits of the input binary word,
   such that upon matching said plurality of fine ladder resistors with said plurality of coarse ladder resistors, a current is obtained proportional to the input binary word, and such that the total string resistance is kept constant, independent of the position, and such that said method provides substantially improved load driving ability.

13. The method of claim 12, wherein said substantially improved load driving ability is manifested as lower equivalent output resistance.

* * * * *